(12) United States Patent
Cheng et al.

(10) Patent No.: US 10,166,650 B2
(45) Date of Patent: Jan. 1, 2019

(54) CHEMICAL-MECHANICAL PLANARIZATION SYSTEM

(71) Applicant: TAIWAN SEMICONDUCTOR MANUFACTURING CO., LTD., Hsinchu (TW)

(72) Inventors: Chung-Liang Cheng, Changhua (TW); Yen-Yu Chen, Taichung (TW); Chang-Sheng Lee, Hsin-Chu (TW); Wei Zhang, Chupei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 43 days.

(21) Appl. No.: 15/221,187

(22) Filed: Jul. 27, 2016

(65) Prior Publication Data
US 2016/0332277 A1   Nov. 17, 2016

Related U.S. Application Data

(62) Division of application No. 14/292,162, filed on May 30, 2014, now Pat. No. 9,425,109.

(51) Int. Cl.
| | |
|---|---|
| *B24B 37/00* | (2012.01) |
| *B24B 37/013* | (2012.01) |
| *H01L 21/66* | (2006.01) |
| *H01L 21/67* | (2006.01) |
| *H01L 21/306* | (2006.01) |

(Continued)

(52) U.S. Cl.
CPC ............ *B24B 37/013* (2013.01); *B24B 49/12* (2013.01); *H01L 21/28088* (2013.01); *H01L 21/30625* (2013.01); *H01L 21/31053* (2013.01); *H01L 21/67075* (2013.01); *H01L 22/12* (2013.01); *H01L 22/26* (2013.01); *H01L 29/66545* (2013.01); *H01L 29/7851* (2013.01)

(58) Field of Classification Search
CPC .................. B24B 37/013; B24B 49/12; H01L 21/28088; H01L 21/30625; H01L 21/31053; H01L 21/67075; H01L 22/12; H01L 22/26; H01L 29/66545; H01L 29/7851
USPC ............................................. 451/6
See application file for complete search history.

(56) References Cited

U.S. PATENT DOCUMENTS

| | | | | |
|---|---|---|---|---|
| 5,141,312 | A | * | 8/1992 | Thompson ................ G01J 1/04 250/227.11 |
| 5,433,651 | A | * | 7/1995 | Lustig ................... B24B 37/013 216/88 |

(Continued)

OTHER PUBLICATIONS

Non-Final Office Action U.S. Appl. No. 14/292,162 dated Nov. 20, 2015.

(Continued)

*Primary Examiner* — George Nguyen
(74) *Attorney, Agent, or Firm* — Cooper Legal Group, LLC

(57) ABSTRACT

A chemical-mechanical planarization (CMP) system includes a platen, a pad, a polish head, a rotating mechanism, a light source, and a detector. The pad is disposed on the platen. The polish head is configured to hold a wafer against the pad. The rotating mechanism is configured to rotate at least one of the platen and the polish head. The light source is configured to provide incident light to an end-point layer on the wafer. The detector is configured to detect absorption of the incident light by the end-point layer.

20 Claims, 13 Drawing Sheets

(51) Int. Cl.
*H01L 21/3105* (2006.01)
*B24B 49/12* (2006.01)
*H01L 21/28* (2006.01)
*H01L 29/66* (2006.01)
*H01L 29/78* (2006.01)

(56) References Cited

U.S. PATENT DOCUMENTS

| | | | |
|---|---|---|---|
| 5,963,358 A * | 10/1999 | Shields | B82Y 20/00 257/E31.032 |
| 6,146,248 A * | 11/2000 | Jairath | B24B 21/04 257/E21.528 |
| 6,336,841 B1 | 1/2002 | Chang | |
| 6,517,413 B1 | 2/2003 | Hu et al. | |
| 6,586,337 B2 | 7/2003 | Parikh | |
| 6,676,717 B1 | 1/2004 | Birang et al. | |
| 6,809,032 B1 | 10/2004 | Mauersberger et al. | |
| 6,876,454 B1 * | 4/2005 | Birang | B24B 37/013 356/503 |
| 6,911,662 B2 | 6/2005 | Kim et al. | |
| 6,939,198 B1 | 9/2005 | Swedek et al. | |
| 7,264,536 B2 | 9/2007 | Wiswesser et al. | |
| 8,157,614 B2 | 4/2012 | Zhang et al. | |
| 8,523,636 B2 * | 9/2013 | Uchiyama | B23K 26/0823 451/41 |
| 9,153,452 B2 * | 10/2015 | Liu | H01L 22/26 |
| 9,425,109 B2 * | 8/2016 | Cheng | H01L 22/26 |
| 2003/0081205 A1 * | 5/2003 | Klose | G01N 21/65 356/301 |
| 2004/0109174 A1 * | 6/2004 | Lebel | B08B 5/02 356/630 |
| 2005/0142991 A1 * | 6/2005 | Nakao | B24B 37/013 451/64 |
| 2006/0079007 A1 * | 4/2006 | Zutshi | B24B 37/013 438/7 |
| 2006/0166606 A1 * | 7/2006 | Kobayashi | B24B 49/12 451/6 |
| 2008/0181467 A1 * | 7/2008 | Zappia | G06K 9/00604 382/117 |
| 2008/0227367 A1 * | 9/2008 | Birang | B24B 37/013 451/6 |
| 2009/0153859 A1 * | 6/2009 | Kimba | B24B 37/013 356/369 |
| 2010/0142189 A1 * | 6/2010 | Hong | C09K 11/616 362/97.3 |
| 2010/0227532 A1 * | 9/2010 | Ishibashi | C09G 1/02 451/36 |
| 2012/0111495 A1 * | 5/2012 | Shimoi | B23K 26/0057 156/250 |
| 2013/0050813 A1 * | 2/2013 | Kim | G01N 21/648 359/385 |
| 2013/0061799 A1 * | 3/2013 | Hayashi | C30B 9/12 117/63 |
| 2014/0340675 A1 * | 11/2014 | Takamatsu | G01N 21/65 356/301 |
| 2015/0162209 A1 | 6/2015 | Liu | |
| 2015/0162210 A1 | 6/2015 | Liu | |
| 2015/0183080 A1 | 7/2015 | Cheng et al. | |

OTHER PUBLICATIONS

Notice of Allowance U.S. Appl. No. 14/292,162 dated Apr. 26, 2016.

* cited by examiner

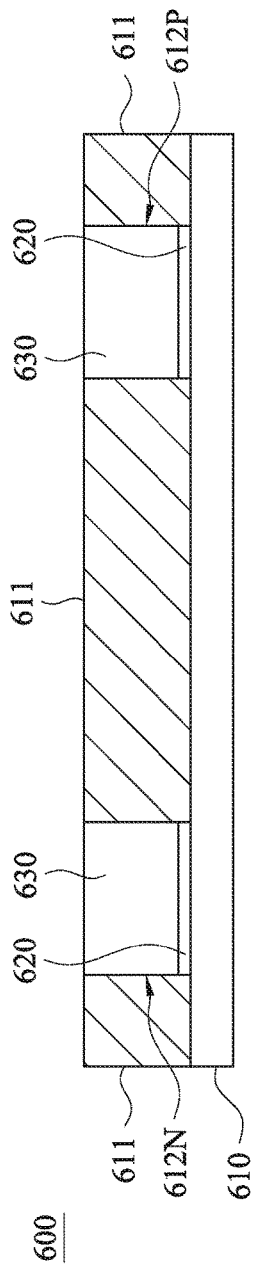
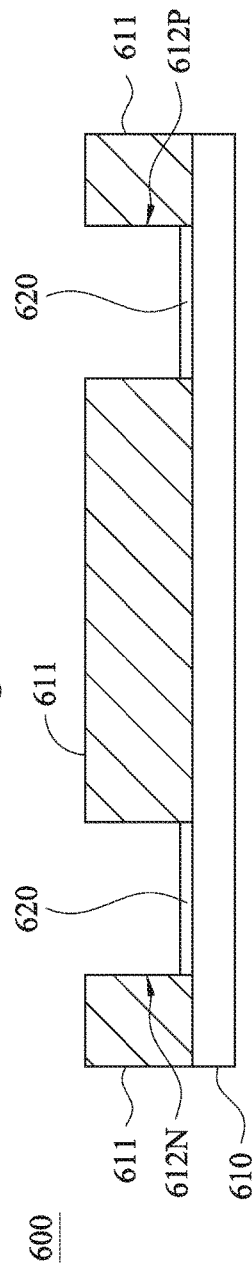
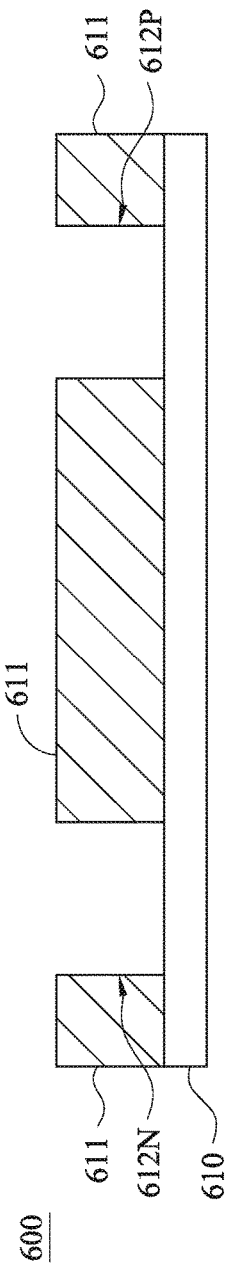

CHEMICAL-MECHANICAL PLANARIZATION SYSTEM

PRIORITY CLAIM AND CROSS-REFERENCE

The present application is a divisional application of U.S. application Ser. No. 14/292,162, filed May 30, 2014, which is hereby incorporated by reference in its entirety.

BACKGROUND

As semiconductor devices are scaled down to submicron dimensions, planarization technology becomes increasingly important, both during the fabrication of the device and for the formation of multi-level interconnects and wiring. Chemical-mechanical planarization (CMP) has recently emerged as a promising technique for achieving a high degree of planarization for submicron very large integrated circuit fabrication.

CMP is a process of smoothing surfaces with the combination of chemical and mechanical forces. It can be thought of as a hybrid of chemical etching and free abrasive polishing. The process uses an abrasive and corrosive chemical slurry (commonly a colloid) in conjunction with a polishing pad and retaining platen, typically of a greater diameter than the wafer. The pad and wafer are pressed together by a dynamic polishing head and held in place by a plastic retaining platen. The dynamic polishing head is rotated with different axes of rotation (i.e., not concentric). This removes material and tends to even out any irregular topography, making the wafer flat or planar. This may be necessary in order to set up the wafer for the formation of additional circuit elements. For example, this might be necessary in order to bring the entire surface within the depth of field of a photolithography system, or to selectively remove material based on its position. Typical depth-of-field requirements are down to Angstrom levels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 1G are cross-sectional views of intermediate steps in a replacement polysilicon gate (RPG) loop of a planar semiconductor device according to some embodiments of this disclosure;

DETAILED DESCRIPTION

Figure 1D:
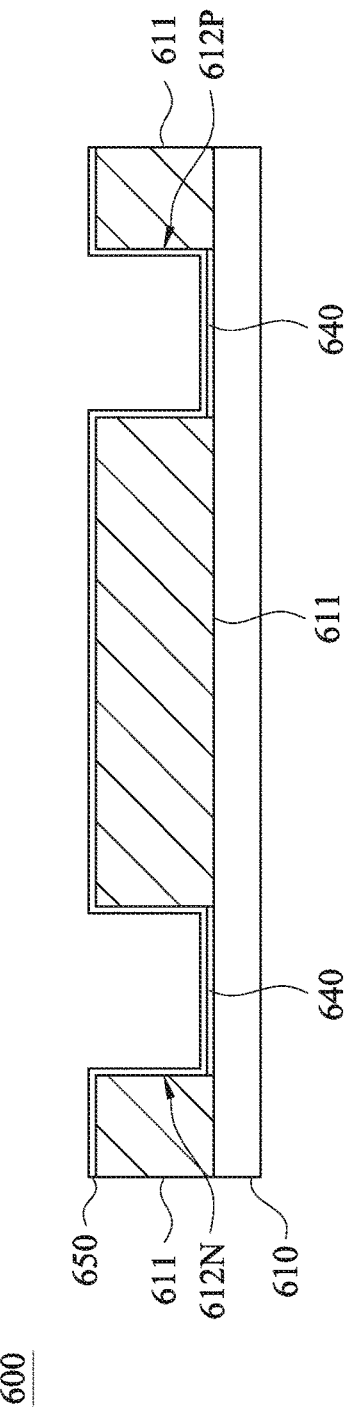

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1A through 1G are cross-sectional views of intermediate steps in a replacement polysilicon gate (RPG) loop of a planar semiconductor device according to some embodiments of this disclosure. As shown in FIG. 1A, a wafer 600 is provided. The wafer 600 includes a substrate 610, an interlayer dielectric layer 611, a dielectric layer 620, and a dummy gate layer 630. The interlayer dielectric layer 611 is formed on the substrate 610. The interlayer dielectric layer 611 has a plurality of slits, such as slits 612N and 612P, therein to expose some parts of the substrate 610. The dielectric layer 620 is formed in the slits 612N and 612P. The dummy gate layer 630 is formed in the slits 612N and 612P and on the dielectric layer 620.

In some embodiments, the substrate 610 is made of a semiconductor, such as silicon (Si), gallium arsenide (GaAs), or silicon-on-insulator (SoI). The interlayer dielectric layer 611 is made of a dielectric material, such as phosphosilicate glass (PSG) or borophosphosilicate glass (BPSG). The thickness of the interlayer dielectric layer 611 is in a range from about 35 nm to about 60 nm. The dielectric layer 620 is made of a dielectric material, such as silicon dioxide ($SiO_2$) or silicon oxynitride (SiON). The thickness of the dielectric layer 620 is in a range from about 2 nm to about 5 nm. The dummy gate layer 630 is made of, for example, polycrystalline silicon (Si). The thickness of the dummy gate layer 630 is in a range from about 40 nm to about 100 nm. The interlayer dielectric layer 611 and the dummy gate layer 630 may be formed by deposition processes, such as chemical vapor deposition (CVD), plasma enhanced chemical vapor deposition (PECVD), or other deposition processes. The dielectric layer 620 may be formed by a thermal process, such as thermal oxidation, or other deposition processes.

Then, as shown in FIG. 1B, the dummy gate layer 630 is removed by etching. Then, as shown in FIG. 1C, the dielectric layer 620 is removed by etching as well.

Then, as shown in FIG. 1D, an intermediate dielectric layer 640 is formed in the slits 612N and 612P and covers the substrate 610, and a high-κ dielectric layer 650 is formed to conformally cover the interlayer dielectric layer 611 and the intermediate dielectric layer 640. In some embodiments, the intermediate dielectric layer 640 is made of a dielectric material, such as silicon dioxide ($SiO_2$) or silicon oxynitride (SiON). The thickness of the intermediate dielectric layer 640 is in a range from about 0.5 nm to about 2 nm. The high-κ dielectric layer 650 is made of a high-κ dielectric material, such as hafnium oxide ($HfO_x$), lanthanum monoxide (LaO), aluminum monoxide (AlO), aluminum oxide ($Al_2O_3$), zirconium monoxide (ZrO), titanium monoxide (TiO), tantalum pentoxide ($Ta_2O_5$), strontium titanate ($SrTiO_3$), barium titanate ($BaTiO_3$), hafnium silicate (HfSiO), lanthanum silicate (LaSiO), aluminum silicate (AlSiO), or hafnium titanate (HfTiO). The thickness of the high-κ dielectric layer 650 is in a range from about 0.5 nm to about 2 nm. The high-κ dielectric layer 650 may be formed by a deposition process, such as chemical vapor deposition (CVD), plasma enhanced chemical vapor deposition (PECVD), or other deposition processes. The intermediate dielectric layer 640 may be formed by a thermal process, such as thermal oxidation, or other deposition processes.

Figure 1E:
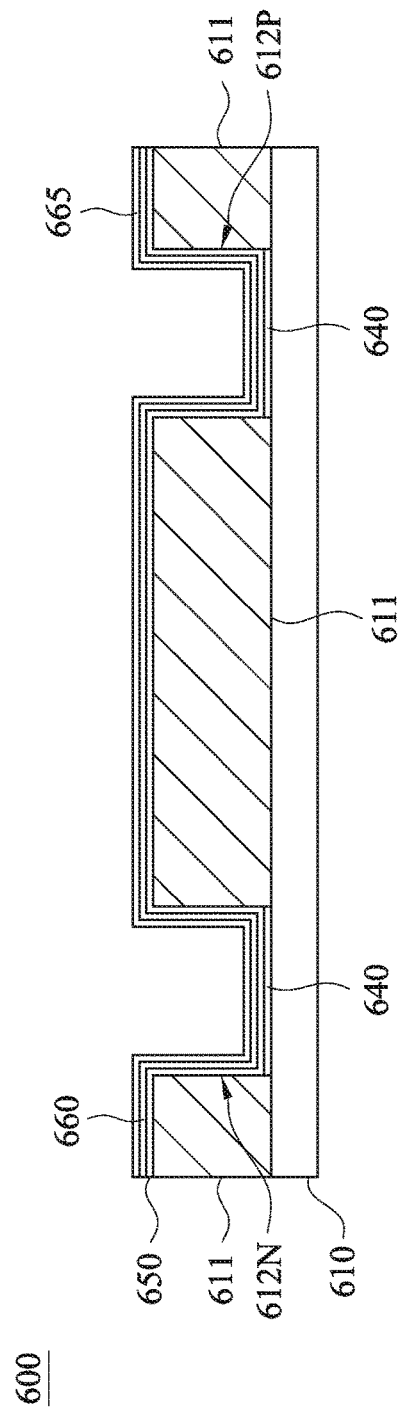

Then, as shown in FIG. 1E, a P-type metal-oxide-semiconductor work function layer (pMOS work function layer) 660 is formed to conformally cover the high-κ dielectric layer 650. In some embodiments, the pMOS work function layer 660 is made of, for example, titanium nitride or silicon nitride. The thickness of the pMOS work function layer 660 is in a range from about 0.5 nm to about 6 nm. The pMOS work function layer 660 may be formed by a deposition process, such as chemical vapor deposition (CVD), plasma enhanced chemical vapor deposition (PECVD), sputtering, or other deposition processes. After the pMOS work function layer 660 is formed, the upper surface of the pMOS work function layer 660 is oxidized to form a surface layer 665. The surface layer 665 can be an end-point layer for a chemical-mechanical planarization (CMP) process. The CMP process is discussed in more detail below.

Figure 1F:
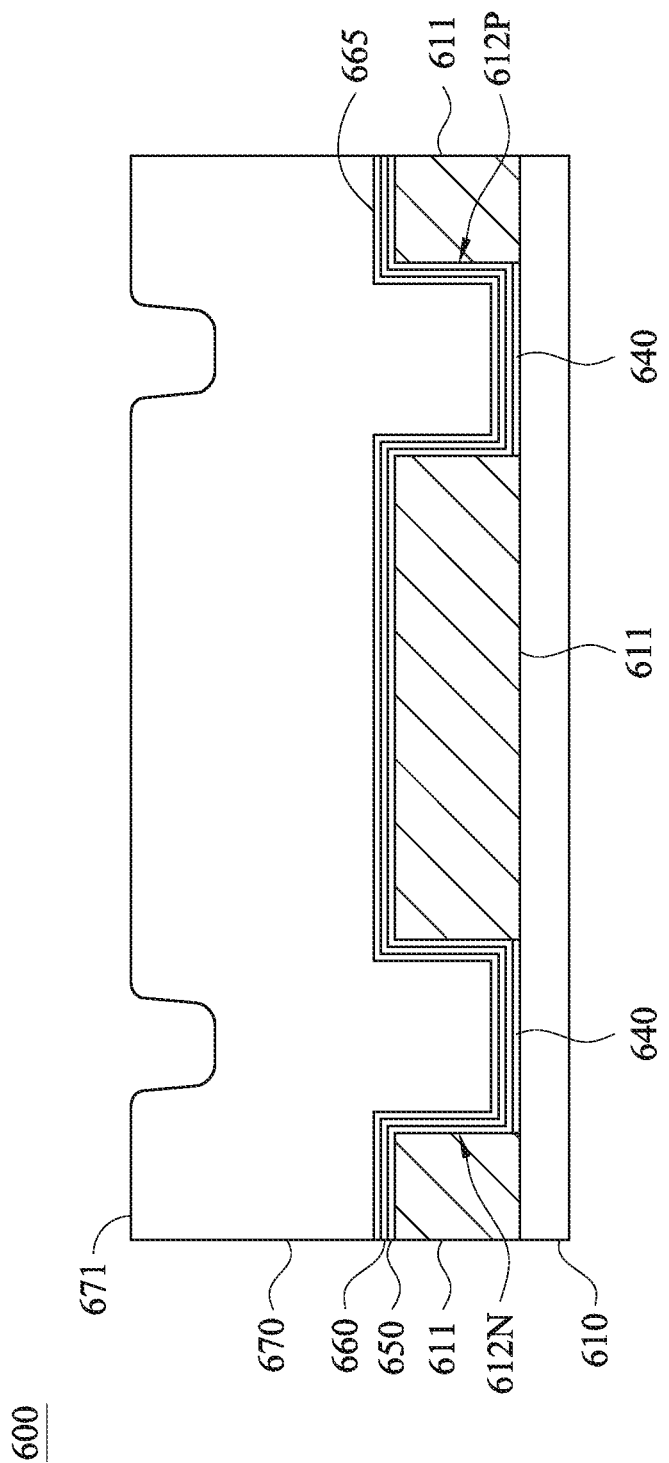

Then, as shown in FIG. 1F, a planarization layer 670 is formed on the surface layer 665. In some embodiments, the planarization layer 670 is made of, for example, silicon dioxide ($SiO_2$). The thickness of the planarization layer 670 is in a range from about 100 nm to about 250 nm. The planarization layer 670 may be formed by, for example, a spin-on glass (SOG) process.

Figure 1G:
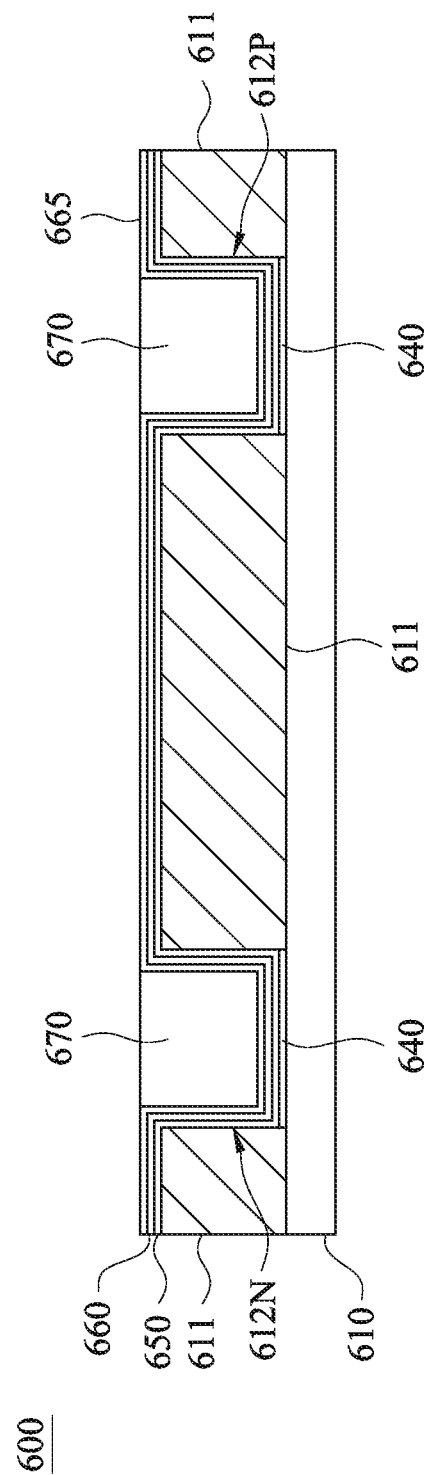

Then, as shown in FIG. 1G, the CMP process is performed on the planarization layer 670 to remove the planarization layer 670 outside the slits 612N and 612P, while leaving the planarization layer 670 remaining in the slits 612N and 612P. After the CMP process, the planarization layer 670 remaining in the slits 612N and 612P is replaced with metal gates to form high-κ/metal gate structures.

As shown in FIGS. 1F and 1G, the CMP process to remove the planarization layer 670 outside the slits 612N and 612P is designed to stop at the surface layer 665 to prevent the pMOS work function layer 660 from being damaged by the CMP process. However, the surface layer 665 is thin and is difficult to be detected. Furthermore, as shown in FIG. 1F, since the pMOS work function layer 660 is nonplanar, the upper surface 671 of the planarization layer 670 may also be nonplanar, resulting in a serious pattern loading effect. The pattern loading effect makes it further difficult to stop the CMP process at the surface layer 665.

Figure 2A:
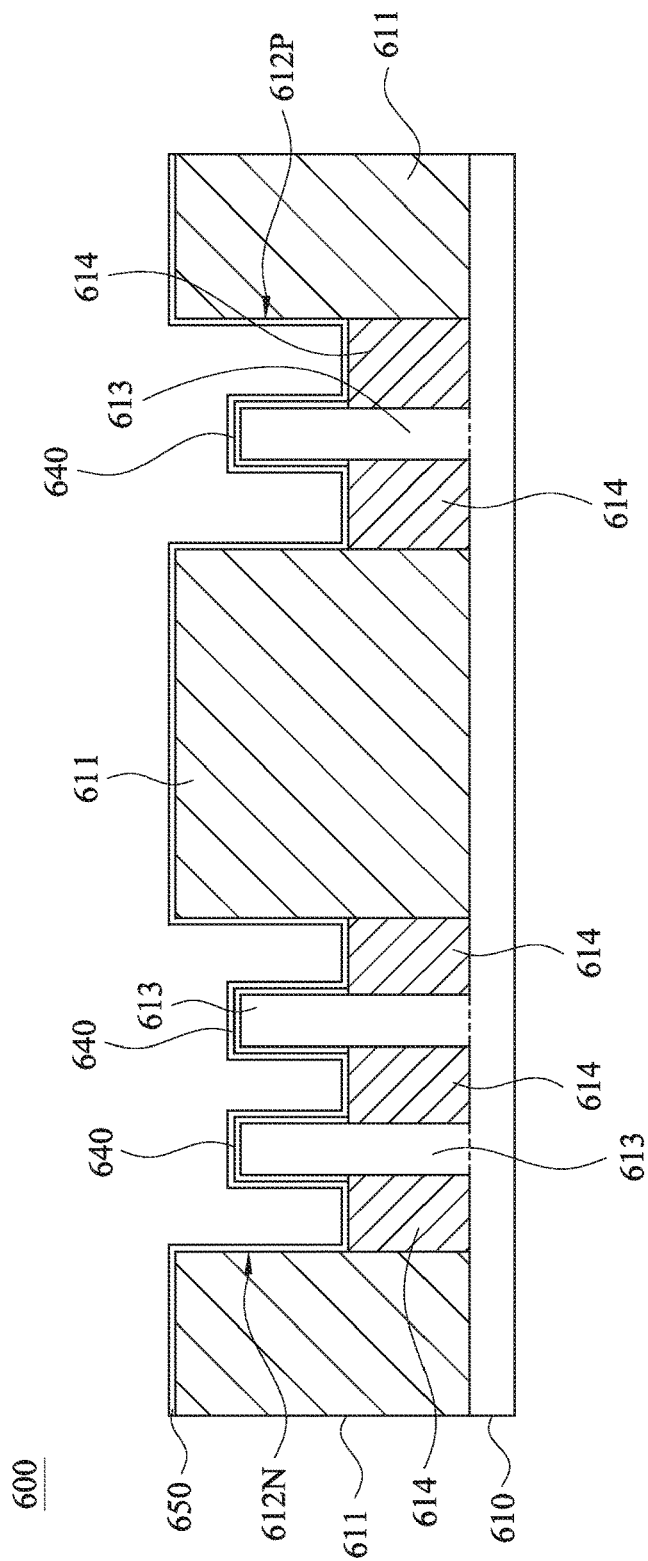
FIGS. 2A through 2D are cross-sectional views of intermediate steps in an RPG loop of a fin field-effect transistor (finFET) semiconductor device according to some embodiments of this disclosure.

FIGS. 2A through 2D are cross-sectional views of intermediate steps in an RPG loop of a fin field-effect transistor (finFET) semiconductor device according to some embodiments of this disclosure. As shown in FIG. 2A, a wafer 600 is provided. The wafer 600 includes a substrate 610, an interlayer dielectric layer 611, a plurality of fins 613, a plurality of shallow trench isolation (STI) dielectrics 614, an intermediate dielectric layer 640, and a high-κ dielectric layer 650. The interlayer dielectric layer 611 is formed on the substrate 610. The interlayer dielectric layer 611 has a plurality of slits, such as slits 612N and 612P, therein to expose some parts of the substrate 610. The fins 613 are disposed on the substrate 610. At least one of the fins 613 is disposed in the slit 612N, and at least one of the fins 613 is disposed in the slit 612P. In FIG. 2A, there are two fins 613 disposed in the slit 612N, and there is one fin 613 disposed in the slit 612P. The STI dielectrics 614 are formed in the slits 612N and 612P. A lower portion of at least one of the fins 613 is surrounded by at least one of the STI dielectrics 614. For example, a lower portion of the fin 613 in the slit 612P is surrounded by the STI dielectric 614 in the slit 612P. The intermediate dielectric layer 640 covers the fins 613. The high-κ dielectric layer 650 is formed to conformally cover the interlayer dielectric layer 611, the STI dielectrics 614, and the intermediate dielectric layer 640, and some parts of the high-κ dielectric layer 650 are disposed in the slits 612N and 612P.

In some embodiments, the substrate 610 is made of a semiconductor, such as silicon (Si), gallium arsenide (GaAs), or silicon-on-insulator (SoI). The interlayer dielectric layer 611 is made of a dielectric material, such as phosphosilicate glass (PSG) or borophosphosilicate glass (BPSG). The thickness of the interlayer dielectric layer 611 is in a range from about 200 nm to about 300 nm. The fins 613 are made of a semiconductor material, such as silicon (Si) or silicon germanium (SiGe). The height of at least one of the fins 613 is in a range from about 180 nm to about 220 nm. The STI dielectrics 614 are made of a dielectric material, such as silicon dioxide ($SiO_2$). The thickness of at least one of the STI dielectrics 614 is in a range from about 120 nm to about 150 nm. The intermediate dielectric layer 640 is made of a dielectric material, such as silicon dioxide ($SiO_2$) or silicon oxynitride (SiON). The thickness of the intermediate dielectric layer 640 is in a range from about 0.5 nm to about 2 nm. The high-κ dielectric layer 650 is made of a high-κ dielectric material, such as hafnium oxide ($HfO_x$), lanthanum monoxide (LaO), aluminum monoxide (AlO), aluminum oxide ($Al_2O_3$), zirconium monoxide (ZrO), titanium monoxide (TiO), tantalum pentoxide ($Ta_2O_5$), strontium titanate ($SrTiO_3$), barium titanate ($BaTiO_3$), hafnium silicate (HfSiO), lanthanum silicate (LaSiO), aluminum silicate (AlSiO), or hafnium titanate (HfTiO). The thickness of the high-κ dielectric layer 650 is in a range from about 0.5 nm to about 2 nm. The interlayer dielectric layer 611, the STI dielectrics 614, and the high-κ dielectric layer 650 may be formed by deposition processes, such as chemical vapor deposition (CVD), plasma enhanced chemical vapor deposition (PECVD), or other deposition processes. The intermediate dielectric layer 640 may be formed by a thermal process, such as thermal oxidation, or other deposition processes. The fins 613 may be formed by etching the substrate 610.

Figure 2B:
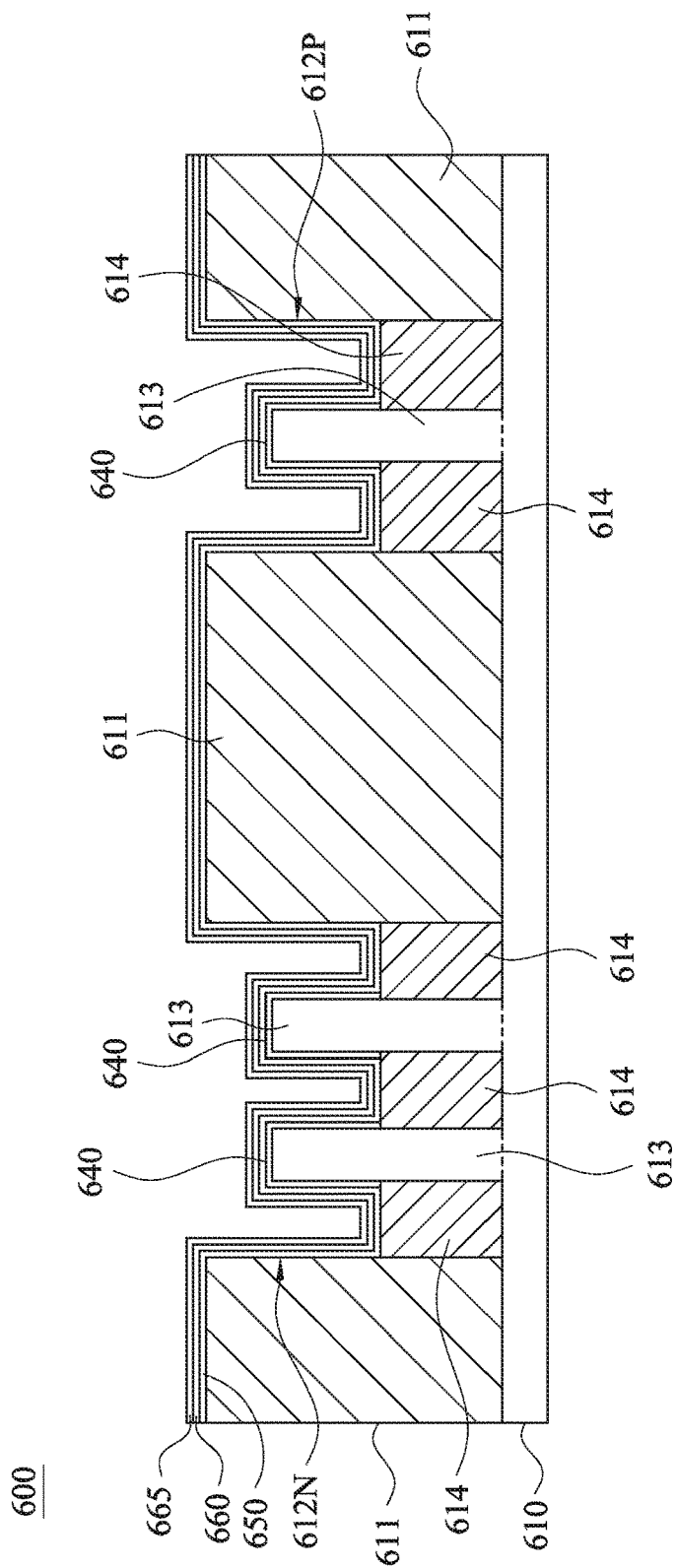

Then, as shown in FIG. 2B, a pMOS work function layer 660 is formed to conformally cover the high-κ dielectric layer 650. In some embodiments, the pMOS work function layer 660 is made of, for example, titanium nitride or silicon nitride. The thickness of the pMOS work function layer 660 is in a range from about 0.5 nm to about 6 nm. The pMOS work function layer 660 may be formed by a deposition process, such as chemical vapor deposition (CVD), plasma enhanced chemical vapor deposition (PECVD), sputtering, or other deposition processes. After the pMOS work function layer 660 is formed, the upper surface of the pMOS work function layer 660 is oxidized to form a surface layer 665. The surface layer 665 can be an end-point layer for a CMP process. The CMP process is discussed in more detail below.

Figure 2C:
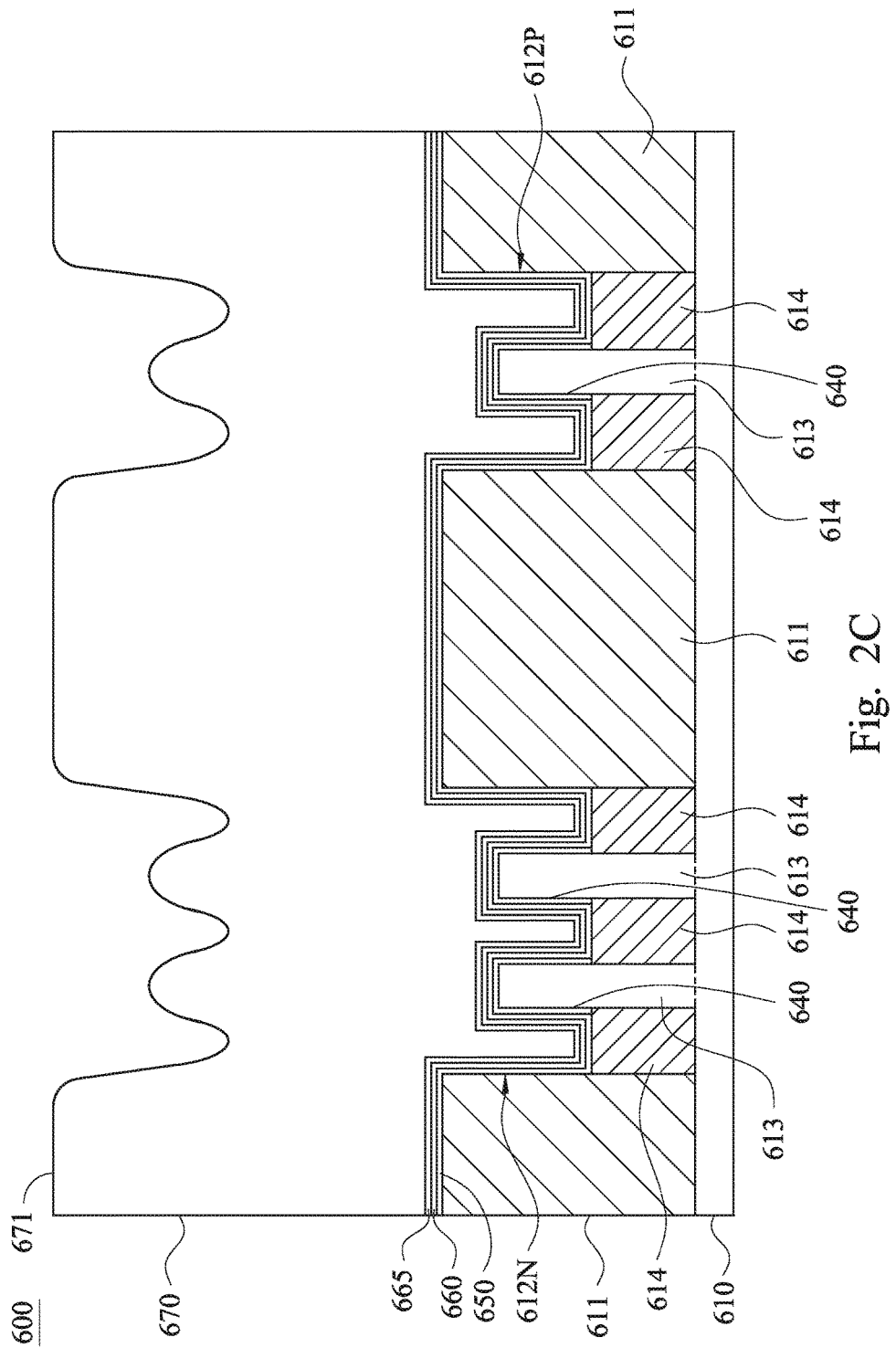

Then, as shown in FIG. 2C, a planarization layer 670 is formed on the surface layer 665. In some embodiments, the planarization layer 670 is made of, for example, silicon dioxide ($SiO_2$). The thickness of the planarization layer 670 is in a range from about 100 nm to about 250 nm. The planarization layer 670 may be formed by, for example, a spin-on glass (SOG) process.

Figure 2D:
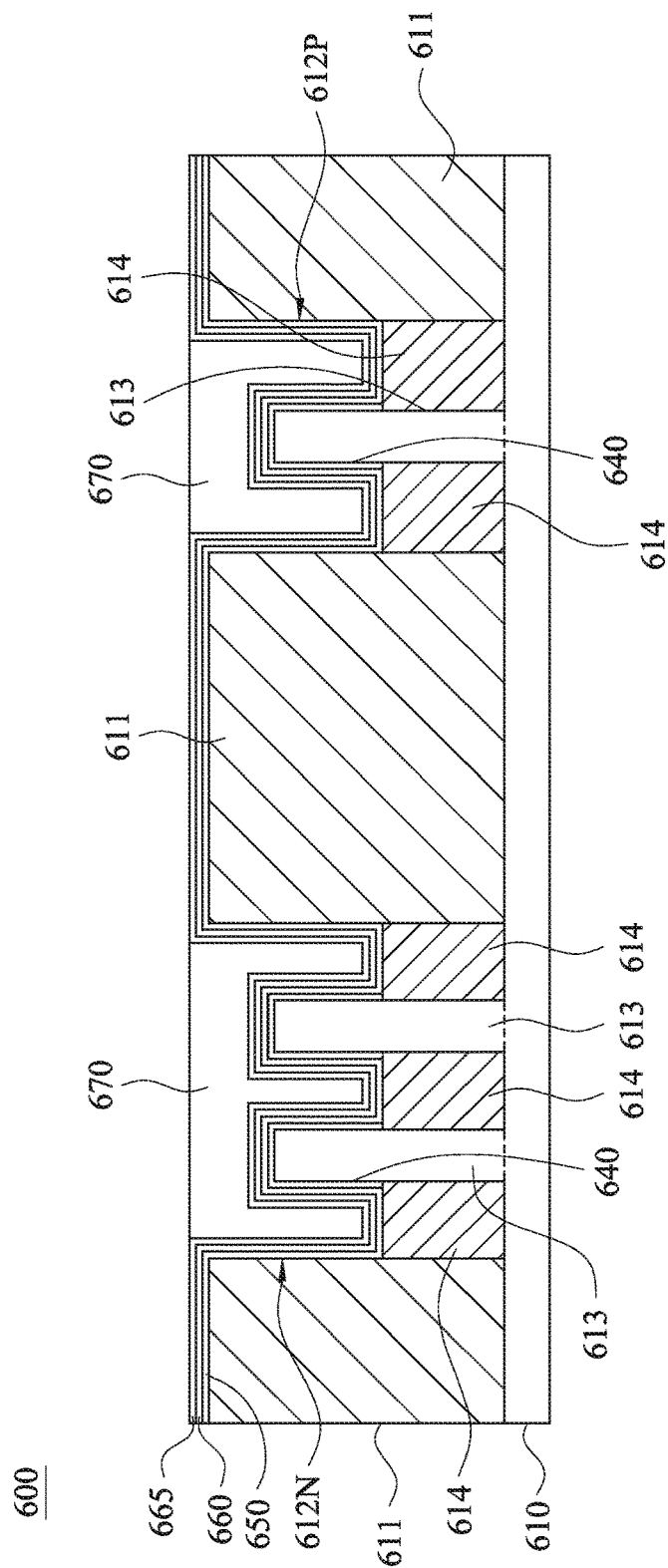

Then, as shown in FIG. 2D, the CMP process is performed on the planarization layer 670 to remove the planarization layer 670 outside the slits 612N and 612P, while leaving the planarization layer 670 remaining in the slits 612N and 612P.

As shown in FIG. 2C, due to the nonplanar structure of the interlayer dielectric layer 611, the fins 613, and the STI dielectrics 614, the upper surface 671 of the planarization layer 670 may also be nonplanar, resulting in a pattern loading effect. The pattern loading effect may be more serious in the finFET semiconductor device than in the planar semiconductor device due to the fins 613, and thus it becomes further difficult to stop the CMP process at the surface layer 665.

According to various embodiments of the present disclosure, a planarization method, a method for polishing a wafer, and a CMP system are provided to stop the CMP process at an end point layer, e.g. the surface layer 665 (shown in FIGS. 1F and 1G or FIGS. 2C and 2D).

Figure 3:
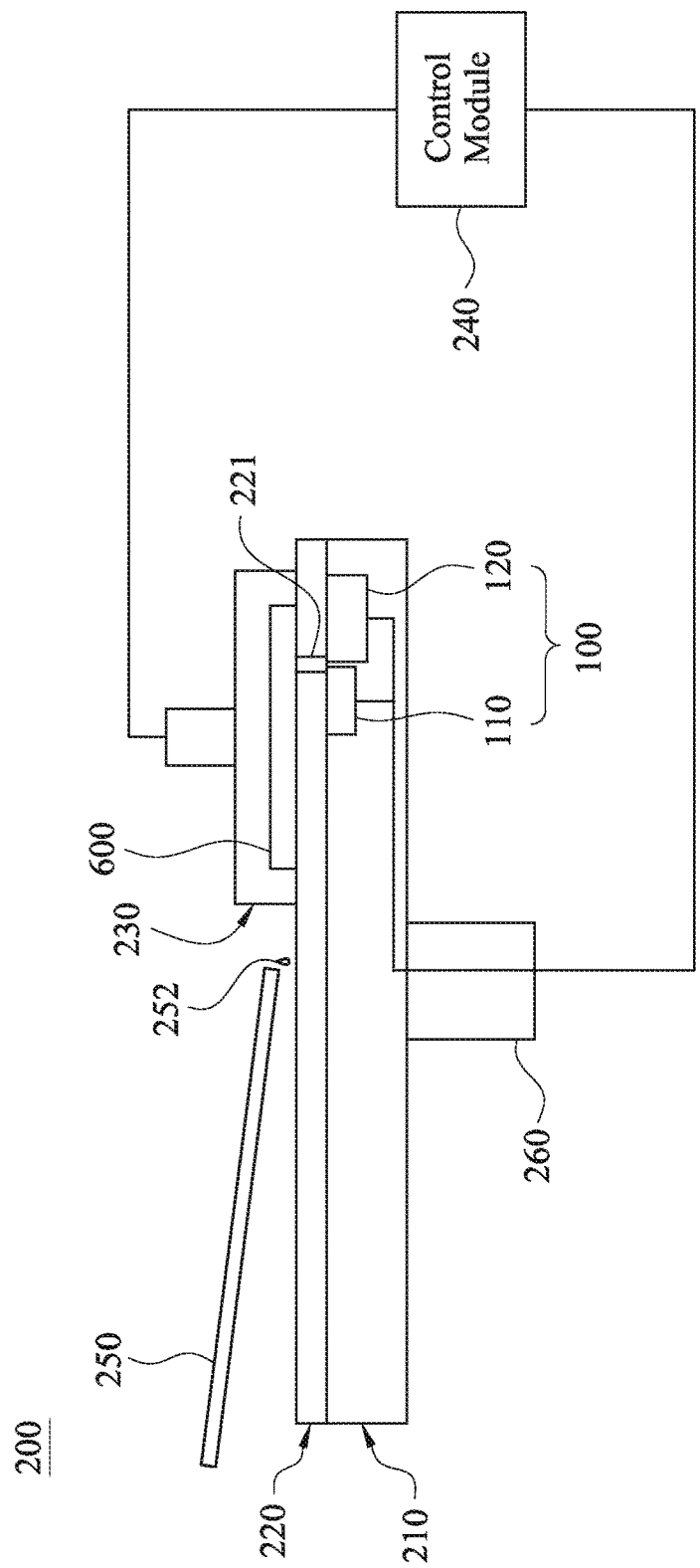
FIG. 3 is a schematic view of a chemical-mechanical planarization (CMP) system and a wafer according to some embodiments of this disclosure.
Figure 4:
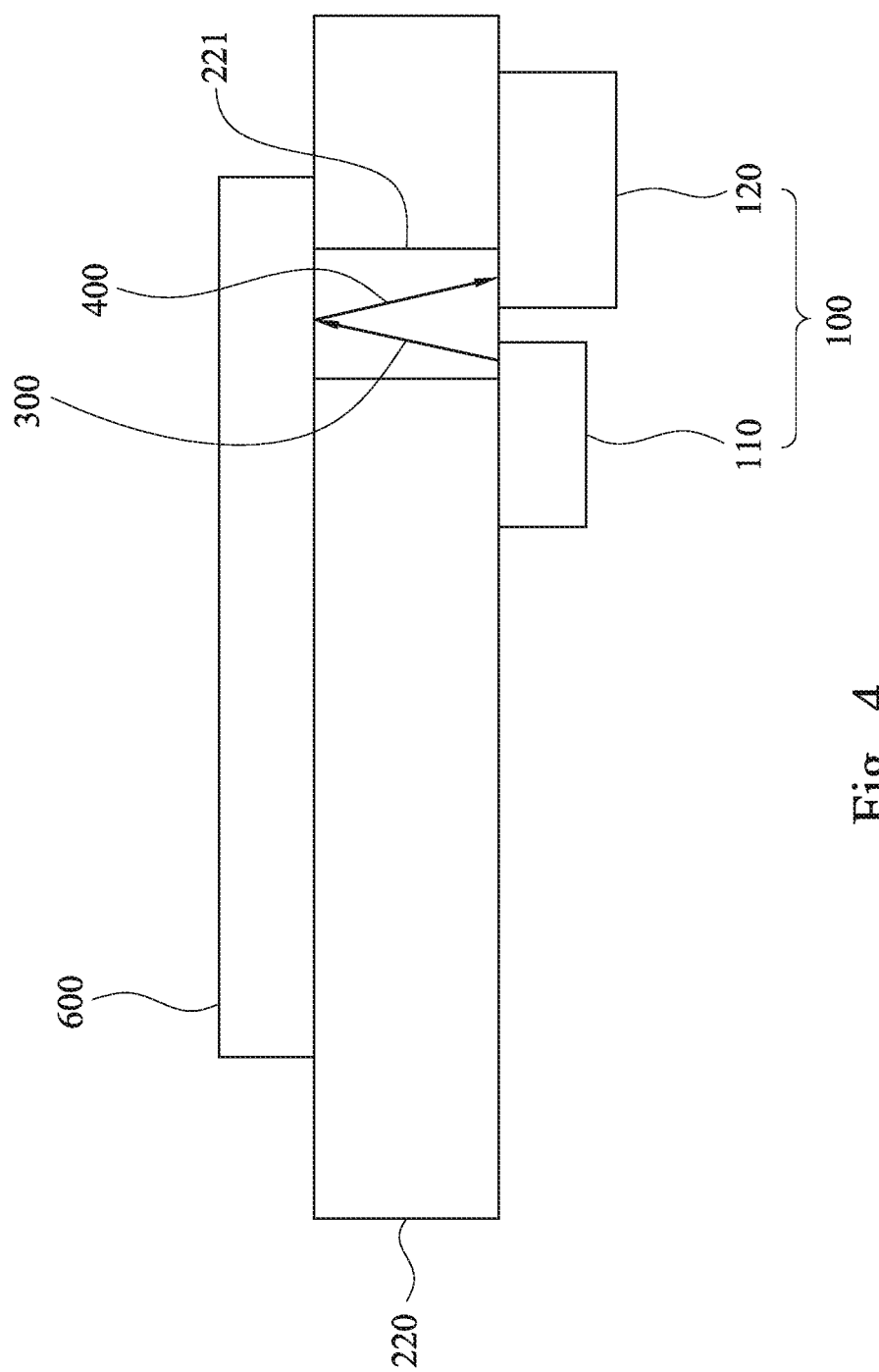
FIG. 4 is a schematic view of a CMP end-point detection system, a pad, and the wafer according to some embodiments of this disclosure.

FIG. 3 is a schematic view of the CMP system 200 and the wafer 600 according to some embodiments of this disclosure. FIG. 4 is a schematic view of a CMP end-point detection system 100, a pad 220, and the wafer 600 according to some embodiments of this disclosure. As shown in FIGS. 3 and 4, the CMP system 200 includes a platen 210, the pad 220, a polish head 230, a slurry introduction mechanism 250, a rotating mechanism 260, the CMP end-point detection system 100, and a control module 240. The pad 220 is disposed on the platen 210, and the pad 220 has a window 221 therein. The polish head 230 holds the wafer 600 against the pad 220. The slurry introduction mechanism 250 introduces slurry 252 onto the pad 220. The rotating mechanism 260 rotates at least one of the platen 210 and the polish head 230. The CMP end-point detection system 100 includes a light source 110 and a detector 120. When the CMP system 200 is used to perform the CMP process, the light source 110 can provide an incident light 300 to an end point layer, e.g. the surface layer 665 (shown in FIGS. 1F and 1G or FIGS. 2C and 2D). The detector 120 can detect absorption of the incident light 300 by the end point layer. The control module 240 can stop the rotating mechanism 260 to rotate at least one of the platen 210 and the polish head 230 in response to an increase in the detected absorption of the incident light 300.

In some embodiments of this disclosure, the photon energy of the incident light 300 provided by the light source 110 is greater than the band gap energy of the end point layer. Because the photon energy of the incident light 300 is greater than the band gap energy of the end point layer, the photons of the incident light 300 excites the end point layer when the photons of the incident light 300 hit the end point layer. Thus, the photon energy of the incident light 300 is absorbed by the end point layer, and the photon energy of the incident light 300 absorbed by the end point layer is substantially equal to the band gap energy of the end point layer. Then, the end point layer emits an exiting light 400 or reflects the incident light 300 to be the exiting light 400.

The detector 120 receives the exiting light 400 and detects the absorption of the incident light 300 by the end point layer according to the received exiting light 400. The absorption of the incident light 300 by the end point layer increases when the end point layer is exposed. Therefore, the CMP system 200 can stop the CMP process at the end point layer in response to the increase in the absorption of the incident light 300 by the end point layer.

Figure 5A:
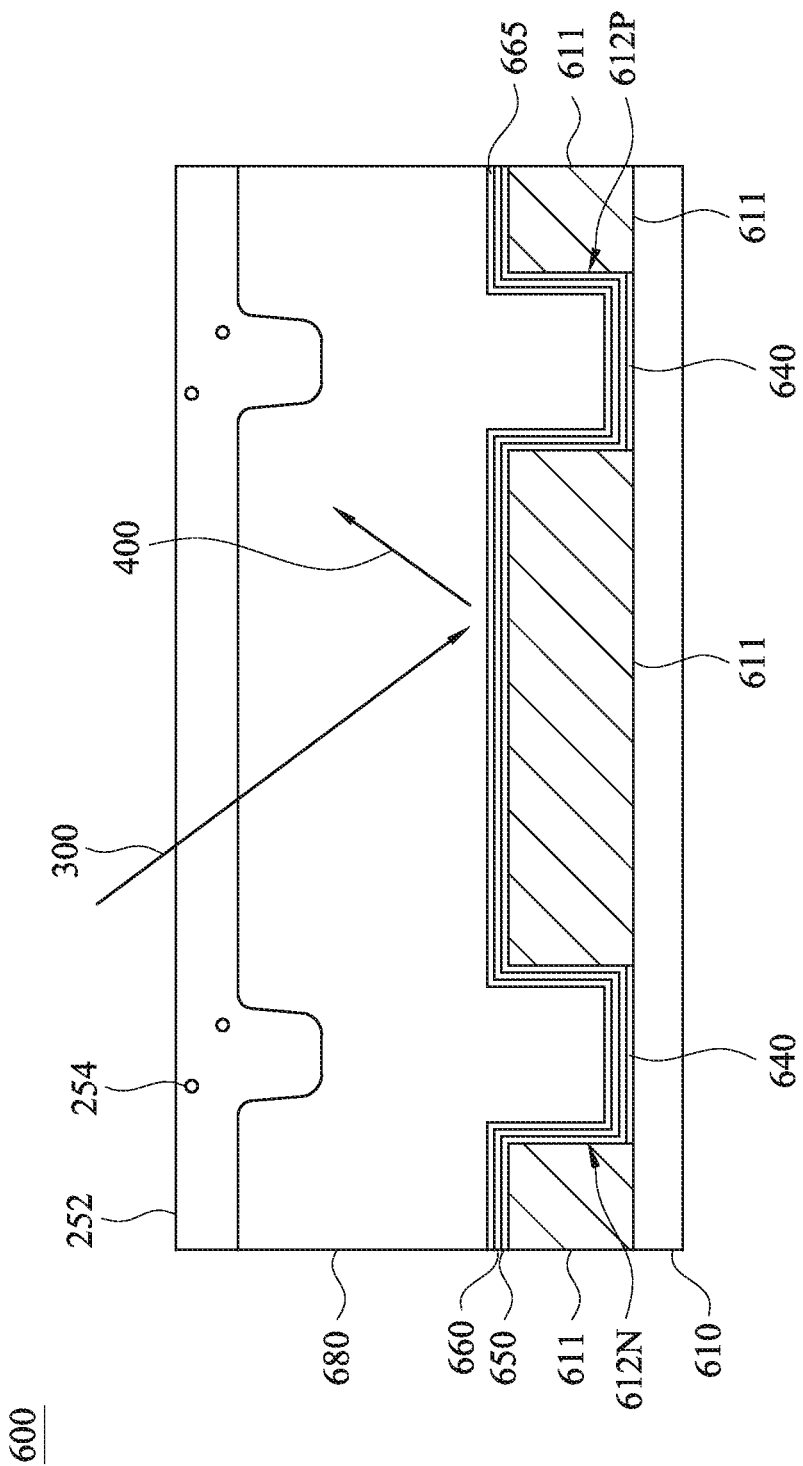
FIGS. 5A and 5B is a schematic cross-sectional view of the wafer during a CMP process shown in FIGS. 1F and 1G.
Figure 5B:
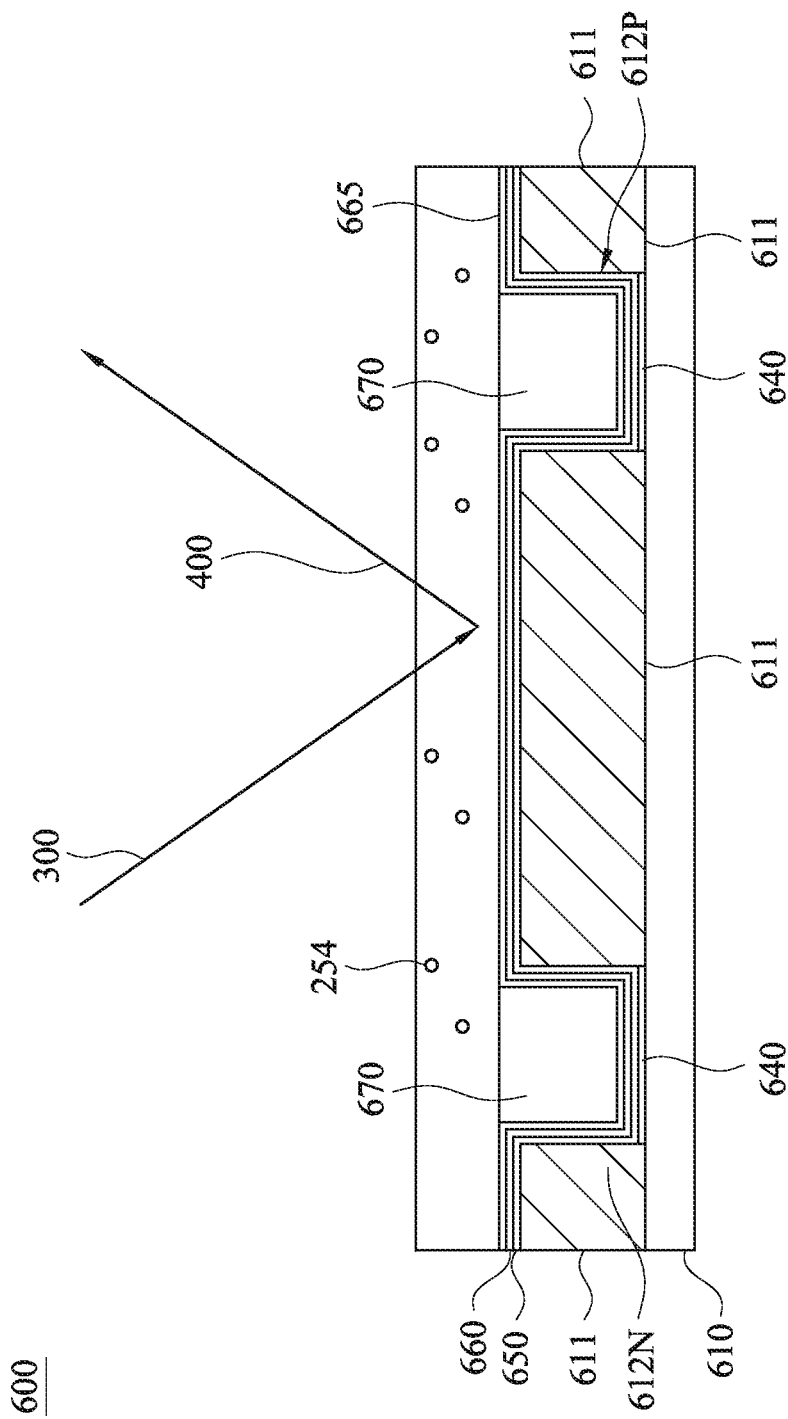

FIGS. 5A and 5B is a schematic cross-sectional view of the wafer 600 during the CMP process shown in FIGS. 1F and 1G. As shown in FIGS. 3, 4 and 5A, the surface layer 665 is sandwiched between the planarization layer 670 and the pMOS work function layer 660. When the CMP system 200 is actuated to polish the wafer 600, the CMP end-point detection system 100 is also activated to detect whether the surface layer 665 is exposed, i.e. whether the planarization layer 670 is removed.

When the CMP end-point detection system 100 is activated, the light source 110 provides the incident light 300 to a surface of the wafer 600 under the CMP process. Specifically, when the incident light 300 passes the planarization layer 670, the majority of the incident light 300 is scattered or absorbed by the planarization layer 670. Therefore, even if a portion of the incident light 300 hits the surface layer 665, the amount of the incident light 300 that hits the surface layer 665 is small. Therefore, the amount of the detected absorption of the incident light 300 by the surface layer 665 is small as well.

As shown in FIGS. 3, 4, and 5B, when the planarization layer 670 outside the slit 612N and 612P is removed by the CMP process, and the surface layer 665 is exposed, the incident light 300 hits the surface layer 665 without obstacles, and the incident light 300 directly excites the surface layer 665. As a result, the detected absorption of the incident light 300 by the surface layer 665 increases, and the CMP system 200 can stop the CMP process at the surface layer 665 in response to the increase in the detected absorption of the incident light 300.

In some embodiments, the surface layer 665 may be made of a semiconductor material, such as titanium oxide ($TiO_x$), specifically, titanium dioxide ($TiO_2$), or titanium oxynitride (TiON). Titanium oxide or titanium oxynitride may be formed by oxidizing the upper surface of the pMOS work function layer 660 when the pMOS work function layer 660 is made of titanium nitride (TiN). The oxidation of the upper surface of the pMOS work function layer 660 occurs when the vacuum environment for forming the pMOS work function layer 660 is broken.

When the surface layer 665 is made of titanium dioxide, the photon energy of the incident light 300 provided by the light source 110 may be greater than approximately $5.2 \times 10^{-19}$ joules, which is equal to the band gap energy of titanium dioxide. In other words, a frequency of the incident light 300 provided by the light source 110 is greater than approximately $7.9 \times 10^{14}$ Hz, or a wavelength of the incident light 300 provided by the light source 110 is approximately shorter than 380 nm.

In some embodiments, the surface layer 665 is made of amorphous silicon oxide ($SiO_x$), specifically, amorphous silicon dioxide ($SiO_2$). The photoelectric characteristics of amorphous silicon dioxide are similar to semiconductor materials. Amorphous silicon dioxide may be formed by thermally oxidizing the upper surface of the pMOS work function layer 660 in an oxygen and/or nitrogen environment when the pMOS work function layer 660 is made of silicon nitride (SiN).

In some embodiments, the light source 110 may be a laser module. The intensity of the incident light 300 emitted by the laser module is strong, so the intensity of the exiting light 400 is also strong enough to be detected by detector 120.

In some embodiments, the light source 110 is a helium-cadmium laser. The frequency of the laser emitted by the helium cadmium laser is approximately $9.2 \times 10^{14}$ Hz. In other words, the wavelength of the laser emitted by the helium cadmium laser is approximately 325 nm.

In some embodiments, photoluminescence emitted by the surface layer 665 is considered the exiting light 400. The detector 120 is a photoluminescence light detector for detecting the photoluminescence emitted by the surface layer 665 due to the absorption of the incident light 300. When the incident light 300 hits the surface layer 665, valence electrons of the surface layer 665 are excited, and then the excited electrons of the surface layer 665 emit the exiting light 400 with photon energy substantially equal to the band gap energy of the surface layer 665 and then become ground state electrons.

In some embodiments, a photon energy detection range of the detector 120 encompasses the band gap energy of the surface layer 665. When the surface layer 665 is made of titanium dioxide, the detector 120 may be an ultraviolet light detector. The photon energy detection range of the detector 120 is from about $2.8 \times 10^{-19}$ joules to about $6.6 \times 10^{-19}$ joules, which encompasses the band gap energy of titanium dioxide. In other words, a frequency detection range of the detector 120 is from about $4.3 \times 10^{14}$ Hz to about $1.0 \times 10^{15}$ Hz, or a wavelength detection range of the detector 120 is from about 300 nm to about 700 nm. In some embodiments, when the surface layer 665 is made of amorphous silicon oxide, the detection range of the detector 120 may vary to encompass the band gap energy of amorphous silicon dioxide.

In some embodiments, the reflected incident light from the surface layer 665 is considered the exiting light 400. When the incident light 300 hits the surface layer 665, the surface layer 665 is excited, and a part of the photon energy of the incident light 300 is absorbed by the valence electrons of the surface layer 665. Then, the incident light 300 is reflected by the surface layer 665 and becomes the exiting light 400. An energy difference between the photon energy of the incident light 300 and the photon energy of the exiting light 400 is substantially equal to the band gap energy of the surface layer 665. Therefore, the detector 120 can determine whether light received by the detector 120 originates from the surface layer 665 according to its photon energy.

If the light source 110 is a laser module, which emits monochromatic light, the photon energy of the incident light 300 is fixed, and the photon energy of the exiting light 400 originating from the surface layer 665 is fixed in a small range. Therefore, the detector 120 can be designed to detect only light with photon energy in the small range, and the detection may become more precise.

For detecting the incident light 300 reflected by the surface layer 665, the detector 120 may be a Raman scattering spectrum detector. When the surface layer 665 is made of titanium dioxide, a wavenumber range of the Raman scattering spectrum detector 120 is from about 800 $centimeter^{-1}$ to 2000 $centimeter^{-1}$.

The window 221 is substantially transparent to the incident light 300 and the exiting light 400. The light source 110 and the detector 120 are disposed beneath the pad 220, and the light source 110 and the detector 120 are disposed adjacent to the window 221. Therefore, the incident light 300 provided by the light source 110 can pass through the window 221 and then hits the wafer 600, and the exiting light 400 originating from the wafer 600 can pass through the window 221 and then is received by the detector 120. In some embodiments, the window 221 is a through hole in the pad 220.

Figure 6:
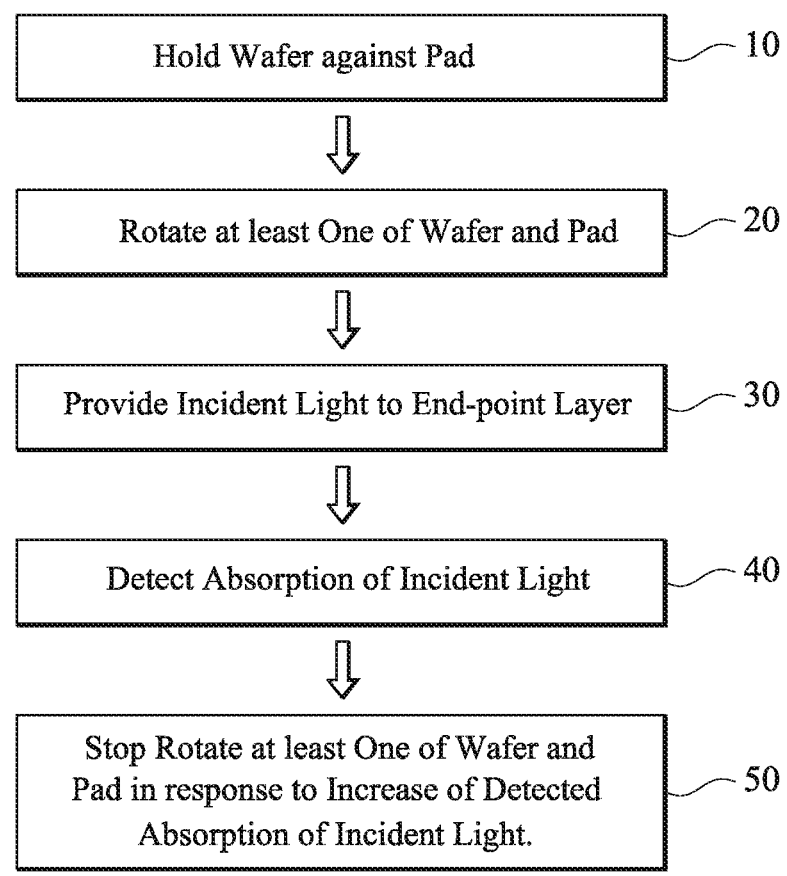
FIG. 6 is a flowchart of a method for polishing the wafer according to some embodiments of this disclosure.

FIG. 6 is a flowchart of a method for polishing the wafer 600 according to some embodiments of this disclosure. As shown in FIGS. 3-6, the method for polishing the wafer 600 includes the following operations. The wafer 600 is held against the pad 220 (operation 10). At least one of the wafer 600 and the pad 220 is rotated (operation 20). The incident light 300 is provided to the surface layer 665, e.g., the end-point layer, on the wafer 600 (operation 30). The absorption of the incident light 300 by the surface layer 665 on the wafer 600 is detected (operation 40). The rotation of at least one of the wafer 600 and the pad 220 is stopped in response to the increase in the detected absorption of the incident light 300 (operation 50).

In operation 50, the detecting can be achieved by detecting photoluminescence emitted by the surface layer 665 due to the absorption of the incident light 300 or by detecting the reflected incident light 300 from the surface layer 665 after the absorption of the incident light 300.

In order to prevent over-polishing during gate formation, a CMP process for removing a planarization layer is designed to stop at a surface layer underneath the planarization layer. The surface layer is formed on a work function layer and oxidized from the work function layer. During the CMP process, an incident light is applied on a wafer surface in contact with the planarization pad of the planarization head. When the planarization layer is removed to expose the surface layer, a detector detects the absorption of the incident light by the surface layer, which could trigger endpoint of the planarization process. The embodiments of endpoint mechanisms described reduce over-polishing.

According to some embodiments, a CMP system includes a platen, a pad, a polish head, a rotating mechanism, a light source, and a detector. The pad is disposed on the platen. The polish head is configured to hold a wafer against the pad. The rotating mechanism is configured to rotate at least one of the platen and the polish head. The light source is configured to provide incident light to an end-point layer on the wafer. The detector is configured to detect absorption of the incident light by the end-point layer.

According to some embodiments, a CMP system includes a platen, a pad, a polish head, a rotating mechanism, a light source, and a detector. The pad is disposed on the platen. The polish head is configured to hold a wafer against the pad. The rotating mechanism is configured to rotate at least one of the platen and the polish head. The light source is configured to provide incident light to an end-point layer on the wafer. The detector is configured to detect exiting light from the end-point layer, in which the detector has a photon energy detection range encompassing band gap energy of the end-point layer.

According to some embodiments, a CMP system includes a platen, a pad, a polish head, a rotating mechanism, a light source, and a detector. The pad is disposed on the platen. The polish head is configured to hold a wafer against the pad. The rotating mechanism is configured to rotate at least one of the platen and the polish head. The light source is configured to provide incident light to an end-point layer on the wafer, in which photon energy of the incident light provided by the light source is greater than band gap energy of the end-point layer. The detector is configured to detect exiting light from the end-point layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical-mechanical planarization (CMP) system comprising:
    a platen;
    a pad disposed on the platen;
    a polish head configured to hold a wafer against the pad;
    a rotating mechanism configured to rotate at least one of the platen and the polish head;
    a light source configured to provide incident light to an end-point layer on the wafer; and
    a detector configured to detect intensity increase due to absorption of the incident light by the end-point layer.

2. The CMP system of claim 1, further comprising:
    a control module configured to stop the rotating mechanism to rotate said at least one of the platen and the polish head in response to an increase in the detected absorption of the incident light.

3. The CMP system of claim 1, wherein the light source is configured to provide the incident light with photon energy greater than band gap energy of the end-point layer.

4. The CMP system of claim 1, wherein the light source is configured to provide the incident light with photon energy greater than approximately $5.2 \times 10^{-19}$ joules.

5. The CMP system of claim 1, wherein the detector has a photon energy detection range encompassing band gap energy of the end-point layer.

6. The CMP system of claim 1, wherein the detector is a photoluminescence light detector configured to detect photoluminescence emitted by the end-point layer due to the absorption of the incident light.

7. The CMP system of claim 1, wherein the detector is an ultraviolet light detector.

8. The CMP system of claim 1, wherein the detector has a photon energy detection range from about $2.8 \times 10^{-19}$ joules to about $6.6 \times 10^{-19}$ joules.

9. The CMP system of claim 1, wherein the detector is a Raman scattering spectrum detector configured to detect reflected incident light from the end-point layer after the absorption of the incident light.

10. The CMP system of claim 9, wherein the Raman scattering spectrum detector has a wavenumber range from about 800 centimeter$^{-1}$ to about 2000 centimeter$^{-1}$.

11. A chemical-mechanical planarization (CMP) system comprising:
    a platen;
    a pad disposed on the platen;
    a polish head configured to hold a wafer against the pad;
    a rotating mechanism configured to rotate at least one of the platen and the polish head;
    a light source configured to provide incident light to an end-point layer on the wafer; and
    a detector configured to detect intensity increase of exiting light from the end-point layer, wherein the detector has a photon energy detection range encompassing a band gap energy of the end-point layer.

12. The CMP system of claim 11, wherein the pad is present between the light source and the wafer, the pad has a window therein, and the window is substantially transparent to the incident light.

13. The CMP system of claim 12, wherein the window is a through hole in the pad.

14. The CMP system of claim 11, wherein the pad is present between the detector and the wafer, the pad has a window therein, and the window is substantially transparent to the exiting light.

15. The CMP system of claim 14, wherein the window is a through hole in the pad.

16. A chemical-mechanical planarization (CMP) system comprising:
    a platen;
    a pad disposed on the platen;
    a polish head configured to hold a wafer against the pad;
    a rotating mechanism configured to rotate at least one of the platen and the polish head;
    a light source configured to provide incident light to an end-point layer on the wafer, wherein photon energy of the incident light provided by the light source is greater than band gap energy of the end-point layer; and a detector configured to detect a change of intensity of exiting light from the end-point layer.

17. The CMP system of claim 16, wherein the light source is a laser module.

18. The CMP system of claim 16, wherein the light source is configured to provide the incident light with a frequency greater than approximately $7.9 \times 10^{14}$ Hz.

19. The CMP system of claim 16, wherein the light source is a helium-cadmium laser module.

20. The CMP system of claim 16, wherein the detector has a frequency detection range from about $4.3 \times 10^{14}$ Hz to about $1.0 \times 10^{15}$ Hz.

* * * * *